(12) United States Patent
Kasperkovitz

(10) Patent No.: US 6,509,802 B2
(45) Date of Patent: Jan. 21, 2003

(54) PLL-TUNING SYSTEM HAVING A PHASE DETECTOR WITH A SAMPLING FREQUENCY EQUAL TO A REFERENCE FREQUENCY

(75) Inventor: Wolfdietrich Georg Kasperkovitz, Waalre (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/834,837

(22) Filed: Apr. 13, 2001

(65) Prior Publication Data

US 2001/0038317 A1 Nov. 8, 2001

(30) Foreign Application Priority Data

Apr. 17, 2000 (EP) .............................. 00201371

(51) Int. Cl.[7] .......................... H03L 7/091; H03D 13/00
(52) U.S. Cl. .................... 331/25; 331/1 A; 327/7; 327/9; 327/156; 327/159
(58) Field of Search ........................... 331/1 A, 14, 17, 331/18, 25; 327/2, 3, 5, 7–9, 156–159

(56) References Cited

U.S. PATENT DOCUMENTS 5,576,664 A  * 11/1996 Herold et al. ................ 331/1 A
6,016,080 A     1/2000 Zuta et al. ..................... 331/25

* cited by examiner

Primary Examiner—David Mis
(74) Attorney, Agent, or Firm—Edward W. Goodman

(57) ABSTRACT

A time discrete PLL-tuning system includes a phase detector and a voltage-controlled oscillator (VCO) for tuning the frequency ($f_{VCO}$) thereof to a frequency equal to N/M times a reference frequency ($f_{REF}$), with M being a factor indicating the number of frequency steps in which a transmitter/receiver channel distance is divided, and N being the number of frequency steps in which the oscillator frequency is divided. The sampling frequency of the phase detector is substantial equal to the reference frequency ($f_{REF}$).

9 Claims, 2 Drawing Sheets

PLL-TUNING SYSTEM HAVING A PHASE DETECTOR WITH A SAMPLING FREQUENCY EQUAL TO A REFERENCE FREQUENCY

BACKGROUND OF THE INVENTION

1. Field of the Invention

The present invention relates to a time discrete PLL-tuning system, comprising a phase detector and a voltage-controlled oscillator (VCO) for tuning the frequency ($f_{VCO}$) thereof to a frequency equal to N/M times a reference frequency ($f_{REF}$), with M being a factor indicating the number of frequency steps in which a transmitter/receiver channel distance is divided, and N being the number of frequency steps in which the oscillator frequency is divided.

2. Description of the Related Art

Such a tuning system is generally known and is applied in radios, tv's, mobile telephones, etc. In the phase detector, the difference between the phase of an input signal with a predetermined frequency step ($f_{STEP}$) and the phase of a signal derived from the VCO output signal by dividing the frequency thereof with the factor N, is detected, filtered and fed back to the VCO. When the frequency step ($f_{STEP}$) is equal to a reference frequency ($f_{REF}$) divided by the factor M, the VCO frequency is tuned to N/M times said reference frequency, i.e., to the frequency (N/M)*$f_{REF}$. The reference frequency may be generated by a crystal oscillator.

The accuracy of the frequency of the tuned oscillator, on the one hand, and the switching speed to switch the oscillator between different frequencies, on the other hand, are limited as a consequence of the low sampling rate of the control loop which locks the tuned oscillator frequency to a frequency proportional to the fixed reference frequency. The best choice of this sampling rate, or sampling frequency, is the frequency step $f_{STEP}$ of the tuned oscillator, this frequency step being usually a fraction (1/M) of the channel distance in telecommunication systems, i.e., $f_{STEP}$=(1/M)*$f_{REF}$. In that case, in practice, the bandwidth of such a the tuning system will be about $f_{STEP}$/10 (instead of the theoretical Nyquist criterion $f_{STEP}$/2). For high accuracy, the frequency step and, therefore, the sampling frequency would be low. This requirement results in a small bandwidth of the sampled control system. However, the small bandwidth, in turn, results in slow switching speeds between different channels. The switching time from one channel to another will be about 1/$f_{STEP}$; the exact value depends on the step size and accuracy. Further, due to the sampling mechanism of the control loop, during tuning, a spurious component with a frequency equal to the frequency step ($f_{STEP}$=$f_{REF}$/M) will always be present in the control loop. This means that a frequency modulated VCO signal will be obtained with the consequence that signals will be received from a transmitter transmitting in a neighboring channel at a frequency distance $f_{STEP}$ from the frequency of the VCO. To keep the spurious signal sufficiently low, heavy loop filtering has to be applied. However, such a loop filtering results in a small bandwidth of the control system and, thus, to a slow switching speed.

Further in an article of Amr N. Hafez and M.I. Elmasry, presented at the IEEE 1999 Custom Integrated Circuits Conference, a wideband tuning system based on a dual (nested) FLL/PLL architecture is described with a PLL as described above. There, the FLL (frequency-locked loop), comprising a frequency-to-voltage feedback loop, integrated in the PLL, has a large bandwidth, a high reference frequency and low accuracy, while the PLL has a small bandwidth, a low reference frequency and high accuracy. In this way, the function of small step size/high accuracy and the function of large loop bandwidth are separated. Due to this separation, however, a disadvantage with respect to fast switching from one channel to another is introduced because the exact frequency is controlled only by the slow PLL. While the VCO frequency is tuned to the frequency step (indicated as reference frequency in said article), the FLL provides for a suppression of the phase noise. The FLL presented in this paper is based on a frequency-to-voltage converter which is critical with respect to high frequency operation. In order to apply this circuit, the clock frequency (spurious) of the FLL has to be reduced via a frequency divider, compared to the high frequency of the VCO. That means that the fundamental advantage of the FLL cannot be fully exploited.

SUMMARY OF THE INVENTION

It is an object of the invention to provide a time discrete PPL-tuning system wherein the disadvantages of the above tuning systems are avoided, this tuning system being accurate and having a high switching speed to switch the oscillator between two different frequencies.

Therefore, according to the invention, the time discrete PLL-tuning system is characterized in that the sampling frequency of the phase detector is substantial equal to the reference frequency ($f_{REF}$). In the generally known PLL-tuning systems, the sampling frequency is, as mentioned above, equal to $f_{STEP}$; according to the invention, the sample frequency is M*$f_{STEP}$. This means that the spurious component has a frequency M*$f_{STEP}$ which can be chosen far beyond the range of present neighboring transmitter/receiver channels, so that a wideband tuning system can be obtained and, thus, a rapid switching speed, while the frequency step can still be low, resulting in a high tuning accuracy. The bandwidth of the PLL-tuning system, according to the invention, is about $f_{REF}$/10, which is a factor $f_{REF}$/$f_{STEP}$=M wider than the bandwidth of the generally known PLL-tuning system.

Such a high sample frequency may be realized in a PLL-tuning system in which the phase detector comprises a first frequency-to-voltage converter, which, in response to the VCO signal, supplies an output signal (k'*$f_{VCO}$) proportional to the oscillator frequency ($f_{VCO}$), a multiplier unit which, in response to said output signal (k'*$f_{VCO}$) of the frequency-to-voltage converter, supplies a signal (k*M*$f_{VCO}$) proportional to the product ($f_{VCO}$) of the oscillator frequency and a factor M, indicating the number of frequency steps in which a transmitter/receiver channel distance is divided, a reference signal unit which, in response to a reference frequency signal, supplies a signal (k*N*$f_{REF}$) proportional to the product of the reference frequency ($f_{REF}$) and a factor N, N being the number of frequency steps in which the oscillator frequency is divided, and a difference circuit supplying a signal proportional to the difference of the product of the oscillator frequency ($f_{VCO}$) and the factor M and of the product of the reference frequency ($f_{REF}$) and the factor N, this difference signal (k*(M*$f_{VCO}$−N*$f_{REF}$)) being subjected to low-pass filtering and supplied to the VCO as a control signal. This means that the VCO control signal Vc can be represented by:

$$V_C = K * M * \int \left( f_{VCO} - \frac{N}{M} f_{REF} \right) * dt$$

This relation will be the same as can be derived for the generally known PLL's mentioned before. The important difference is that, in this embodiment, in spite of a low frequency step, the sample frequency is much higher than in the generally known systems, so that, in this embodiment, $V_{SPURIOUS}$ is formed by a signal with frequency $f_{REF}$, while in the known PLL's, $V_{SPURIOUS}$ is formed by a signal with frequency $f_{REF}/M$.

The signals M and N may be supplied in digital form and are preferably adjustable. In such an embodiment, the multiplier unit may comprise a first DAC (digital-to-analog converter) with a current output to convert the signal M into a current, and a first current switch controlled by the output signal of the first frequency-to-voltage converter. Further, in order to obtain an substantially identical electronic structure, in such an embodiment, the reference signal unit may then comprise a second frequency-to-voltage converter, and a second DAC (digital-to-analog converter) with a current output to convert the signal N into a current to be supplied to a second current switch, this second current switch being controlled by the output signal of the second frequency-to-voltage converter.

In a preferred embodiment, each of the first and second frequency-to-voltage converters comprises an exclusive-OR circuit to which the signal with the oscillator frequency and with the reference frequency, respectively, are supplied directly and after a delay ($\tau$), and low-pass filter means for filtering the output signal of the exclusive-OR circuit. The delay ($\tau$) may be adjustable, which is important to obtain an accurate substantially equal adjustment of both values of the delay ($\tau$) in both frequency-to-voltage converters.

BRIEF DESCRIPTION OF THE DRAWINGS

In the following and with reference to the accompanying drawings, an embodiment according to the invention will be described more in detail. In the drawings.

DESCRIPTION OF THE PREFERRED EMBODIMENTS

Figure 1:
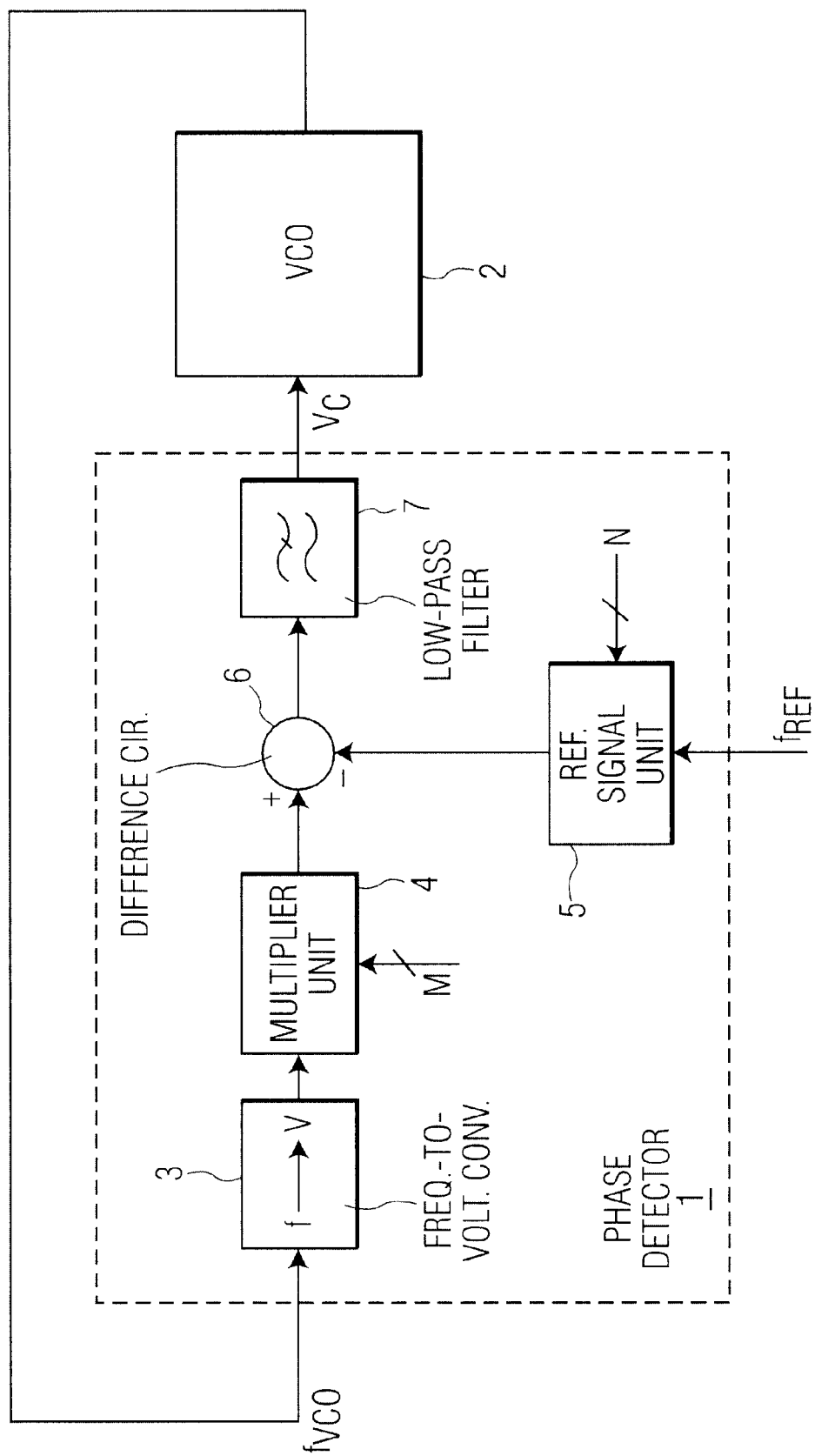
FIG. 1 shows a generalized block schematic diagram of the PLL-tuning system according to the invention.

FIG. 1 shows a phase detector 1 and a voltage-controlled oscillator (VCO) 2. The output signal of the phase detector 1 is the control voltage VC for the VCO, while the output signal with the frequency $f_{VCO}$ forms a first input of the phase detector 1. A signal with the reference frequency $f_{REF}$ forms a second input signal of the phase detector 1. The phase detector 1 comprises a frequency-to-voltage converter 3, a multiplier unit 4, a reference signal unit 5, a difference circuit 6 and a low-pass filter 7. The frequency-to-voltage converter 3 supplies, in response to the input signal from the VCO, a voltage $V=k'*f_{VCO}$, with k' being an adjustable factor or a constant. In the multiplier 4, this signal is multiplied with a factor M, indicating the number of frequency steps $f_{STEP}$ in which a transmitter/receiver channel distance is divided. The output signal of the multiplier 4 may be represented by $k*M*f_{VCO}$, with k being an adjustable factor or a constant, and supplied to the difference circuit 6. The reference signal unit 5 supplies, in response to a reference signal with frequency $f_{REF}$, an output signal, which may be represented by $k*N*f_{REF}$, with N being the number of frequency steps in which the oscillator frequency is divided, and k being an adjustable factor or a constant, and also supplied to the difference circuit 6. The circuits 3, 4 and 5 may be so dimensioned that the signals $M*f_{VCO}$ and $N*f_{REF}$ have the same proportionality factor or constant. The values N and M are supplied in digital form. The output signal of the difference signal $M*f_{VCO}-N*f_{REF}$ is integrated in the low-pass filter 7, whereafter, the control signal:

$$V_C = K * M * \int \left( f_{VCO} - \frac{N}{M} f_{REF} \right) * dt$$

is obtained, with an adjustable factor or a constant. The sample frequency of the PLL tuning system is $f_{REF}=M*f_{STEP}$, with $f_{STEP}$ the frequency step. The bandwidth of the control loop is about fREF/10. The spurious component with frequency $f_{REF}$ is far out of the range of the transmitter/receiver channels.

Figure 2:
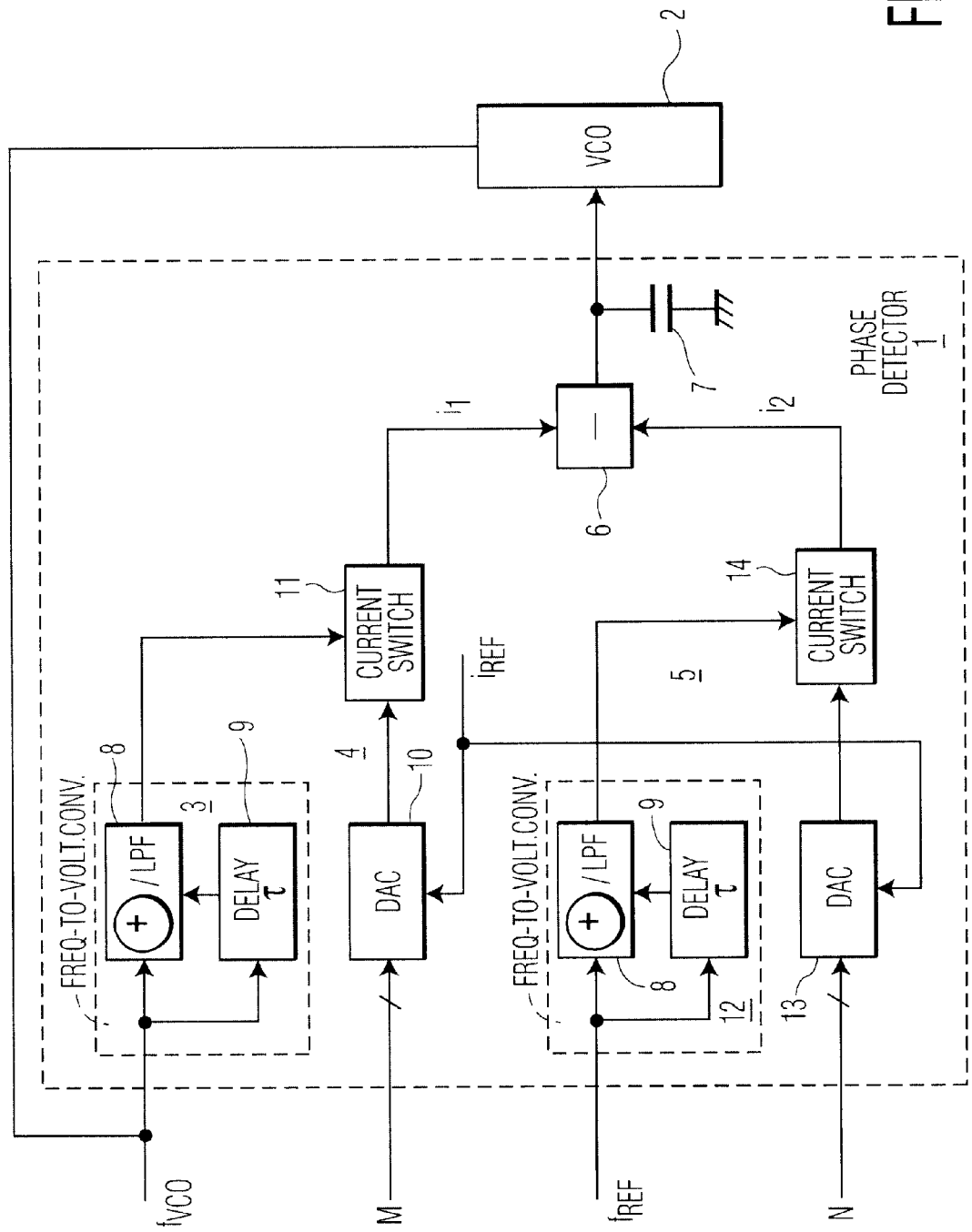
FIG. 2 shows a preferred embodiment of the PLL-tuning system according to the invention.

A preferred embodiment is shown in FIG. 2. The main structure of the block schematic diagram in this figure is the same as in FIG. 1.

The frequency-to-voltage converter 3 comprises an exclusive-OR circuit and low-pass filter combination 8. The output signal of the VCO is supplied to the exclusive-OR circuit and low-pass filter combination 8 directly and after a relatively small delay $\tau$ via a delay circuit 9. The low-pass filtered output signal of this frequency-to-voltage converter 3 is now proportional to $\tau*f_{VCO}$.

The multiplier unit 4 comprises a DAC (digital-to-analog converter) 10 with a current output and a current switch 11. By means of a reference current $i_{REF}$, the value M is converted into a current, proportional to $M*i_{REF}$ and supplied to the current switch 11. Under control of the output signal of the frequency-to-voltage converter 3, a current $i_1$ will pass the current switch 11, this current $i_1$ being proportional to $\tau*i_{REF}*M*f_{VCO}$.

The reference signal unit 5 has the same structure as the combination of the frequency-to-voltage converter 3 with the multiplier unit 4 and comprises a frequency-to-voltage converter 12, a DAC 13 with a current output and a current switch 14. Therefore, the output current $i_2$ is proportional to $\tau*i_{REF}*N*f_{REF}$. When the same DAC's, the same current switches and the same frequency-to-voltage converters are used, the proportionality constants of $i_1$ and $i_2$ are also the same, so that the output signal of the difference circuit will be proportional with:

$\tau*i_{REF}*(M*f_{VCO}-N*f_{REF})$.

After integration, and with $\tau*i_{REF}=K$, the same formula is obtained as given above.

In order to realize equal proportionality constants for $i_1$ and $i_2$, not only the reference signal unit 5 has the same structure as the combination of the frequency-to-voltage converter 3 with the multiplier unit 4, but also the delay $\tau$ is adjustable.

There are many implementations of the delay $\tau$ depending on the required accuracy. The absolute accuracy of the delay, however, is not important because it only affects the loop gain of the control loop which is a rather insensitive parameter. The dominant aspect for accuracy of the VCO frequency is the relative matching of the two delays in the different branches of the phase detector 1 and the accuracy of the DAC's. The most accurate implementation of the delay is a digital implementation with D-flip-flops. Here, again, there are several options for the common clock signal of the D-flip-flops in the two branches. The only consequence on a system level is that the frequency $f_{CLOCK}$ of said clock signal must be higher than the highest input frequency, $f_{VCO}$ or $f_{REF}$. If this is not the case, there is always the possibility to add fixed dividers at the input of the two branches.

An interesting limiting case is the situation where $f_{CLOCK}$ is equal to $f_{REF}$. In this situation, the product $\tau^* f_{REF}$ becomes constant with the consequence that the output current $i_2$ of the branch with $f_{REF}$ as input frequency becomes independent of the input frequency $f_{REF}$, and will only be a function of the dc-current of the programmable DAC 13. Therefore, in this situation, the phase detector 1 can be simplified by using only the frequency-to-voltage converter 3 and the multiplier 4, steered only by the value M.

Another interesting limiting case is the situation where $f_{CLOCK}$ is equal to $f_{VCO}$. In this situation, the product $\tau^* f_{VCO}$ becomes constant, with the consequence that the output current i1 of the branch with $f_{VCO}$ as input frequency becomes independent of the input frequency $f_{VCO}$, and will only be a function of the dc-current of the programmable DAC 10. Therefore, in this situation, the phase detector 1 can be simplified by the reference signal unit 5 steered only by the value N.

What is claimed is:

1. A time discrete PLL-tuning system comprising a phase detector and a voltage-controlled oscillator (VCO) for tuning the frequency thereof to a frequency equal to N/M times a reference frequency, with M being a factor indicating the number of frequency steps in which a transmitter/receiver channel distance is divided, and N being a number of frequency steps in which the oscillator frequency is divided, characterized in that the sampling frequency of the phase detector is substantial equal to the reference frequency.

2. The time discrete PLL-tuning system as claimed in claim 1, characterized in that the phase detector comprises a first frequency-to-voltage converter for supplying, in response to the VCO signal, an output signal proportional to the oscillator frequency, a multiplier unit for supplying, in response to said output signal of the first frequency-to-voltage converter, a signal proportional to the product of the oscillator frequency and a factor M, indicating the number of frequency steps in which a transmitter/receiver channel distance is divided, a reference signal unit for supplying, in response to a reference frequency signal, a signal proportional to the product of the reference frequency and a factor N, N being a number of frequency steps in which the oscillator frequency is divided, and a difference circuit for supplying a signal proportional to a difference of the product of the oscillator frequency and the factor M and of the product of the reference frequency and the factor N, said difference signal being subjected to low-pass filtering and being supplied to the VCO as a control signal.

3. The time discrete PLL-tuning system as claimed in claim 2, characterized in that the signals M and N are supplied in digital form.

4. The time discrete PLL-tuning system as claimed in claim 3, characterized in that the signals N and/or M are adjustable.

5. The time discrete PLL-tuning system as claimed in claim 3 or 4, characterized in that the multiplier unit comprises a first digital-to-analog converter (DAC) with a current output for converting the signal M into a current, and a first current switch controlled by the output signal of the first frequency-to-voltage converter.

6. The time discrete PLL-tuning system as claimed in claim 3 or 4, characterized in that the reference signal unit comprises a second frequency-to-voltage converter, and a second digital-to-analog converter (DAC) with a current output for converting the signal N into a current for application to a second current switch, said second current switch being controlled by an output signal of the second frequency-to-voltage converter.

7. The time discrete PLL-tuning system as claimed in claim 6, characterized in that each of the first and second frequency-to-voltage converters comprises an exclusive-OR circuit to which the signal with the oscillator frequency and with the reference frequency, respectively, are supplied directly and after a delay ($\tau$), and low-pass filter means for filtering the output signal of the exclusive-OR circuit.

8. The time discrete PLL-tuning system as claimed in claim 5, characterized in that the reference signal unit comprises a second frequency-to-voltage converter, and a second digital-to-analog converter (DAC) with a current output for converting the signal N into a current for application to a second current switch, said second current switch being controlled by an output signal of the second frequency-to-voltage converter.

9. The time discrete PLL-tuning system as claimed in claim 8, characterized in that each of the first and second frequency-to-voltage converters comprises an exclusive-OR circuit to which the signal with the oscillator frequency and with the reference frequency, respectively, are supplied directly and after a delay ($\tau$), and low-pass filter means for filtering the output signal of the exclusive-OR circuit.

* * * * *